United States Patent [19]

Sano et al.

[11] 4,297,945
[45] * Nov. 3, 1981

[54] RESIN ORIGINAL PATTERN PLATE AND METHOD FOR TRANSFERRING RELIEVED PATTERN THEREOF TO THERMOPLASTIC RESIN MATERIAL

[75] Inventors: Takezo Sano; Tadanori Inoue, both of Ibaragi; Yukikazu Uemura, Toyonaka, all of Japan

[73] Assignee: Sumitomo Chemical Company, Ltd., Japan

[*] Notice: The portion of the term of this patent subsequent to May 29, 1996, has been disclaimed.

[21] Appl. No.: 19,143

[22] Filed: Mar. 9, 1979

Related U.S. Application Data

[60] Division of Ser. No. 682,724, May 3, 1976, Pat. No. 4,156,384, which is a continuation-in-part of Ser. No. 427,655, Dec. 26, 1973, abandoned.

[30] Foreign Application Priority Data

Dec. 28, 1972 [JP] Japan ................................. 67-1393
Dec. 28, 1972 [JP] Japan ................................. 67-1394

[51] Int. Cl.$^3$ ............................................. B41N 1/12
[52] U.S. Cl. ............................... 101/395; 101/401.1; 101/401.2; 428/172; 428/908; 430/281; 430/306; 430/322; 430/325
[58] Field of Search ............... 428/908, 909, 141, 913, 428/172, 220, 165; 430/322, 306, 281, 325; 264/225, 219, 220, 293; 425/385; 101/401.1, 395, 401.2

[56] References Cited

U.S. PATENT DOCUMENTS

| | | | |
|---|---|---|---|
| 2,964,401 | 12/1960 | Plambeck, Jr. | 96/35.1 |
| 3,062,674 | 11/1962 | Houck et al. | 96/114 |
| 3,186,844 | 6/1965 | Alles et al. | 96/35.1 |
| 3,259,499 | 7/1966 | Thommes | 96/35.1 |
| 3,380,825 | 4/1968 | Webers | 96/35.1 |
| 3,716,338 | 9/1973 | Ungar et al. | 428/409 |
| 3,812,078 | 5/1974 | Takimoto et al. | 260/42.29 |
| 3,990,897 | 11/1976 | Zuercgs et al. | 430/306 |
| 4,079,159 | 3/1978 | Sano et al. | 428/908 |
| 4,103,057 | 7/1978 | Takimoto et al. | 428/172 |
| 4,154,888 | 5/1979 | Dewey | 428/908 |

FOREIGN PATENT DOCUMENTS

745236 of 1970 Belgium .......................... 101/401.1

Primary Examiner—Stanley S. Silverman
Attorney, Agent, or Firm—Stevens, Davis, Miller & Mosher

[57] ABSTRACT

Relieved pattern of a resin original pattern plate, which does not exhibit fluidity at transferring temperature and possesses elastic modulus no smaller than 10 kg/cm$^2$, preferably no smaller than 100 kg/cm$^2$, is transferred onto thermoplastic resin material having fluidity at the transferring temperature (ASTM D1238, load 21.6 kg) of at least 0.01 dg/min, preferably at least 0.1 dg/min, by pressing the thermoplastic resin material to the original pattern plate under a pressure condition where elastic deformation of the original pattern plate is kept within 10%. The resin original pattern plate is prepared by controlling the photo-polymerizable resin composition to adjust its crosslink-ability and then photo-polymerizing, whereby the resulting resin original pattern plate possesses an elastic modulus of 10 kg/cm$^2$ or higher at transferring temperature. The photo-polymerizable resin composition includes, as its major ingredients, either polymer, polyfunctional monomer (10–90% by weight, preferably 30–70% by weight, and having viscosity of at least 10$^3$ poise at transferring temperature), photo-sensitizer and thermal polymerization inhibitor, or cross-linkable polymer (having at least 1000 molecular weight and double bonds at least one for each 1000 molecular weight), monomer (5–50% by weight, preferably 10–40% by weight), photosensitizer and thermal polymerization inhibitor.

3 Claims, No Drawings

RESIN ORIGINAL PATTERN PLATE AND METHOD FOR TRANSFERRING RELIEVED PATTERN THEREOF TO THERMOPLASTIC RESIN MATERIAL

CROSS REFERENCE TO THE RELATED APPLICATION

This is a division of application Ser. No. 682,724, filed May 3, 1976, now U.S. Pat. No. 4,156,384 which in turn is a continuation-in-part of application Ser. No. 427,655, filed Dec. 26, 1973, now abandoned.

The present invention relates to a method for transferring a relieved pattern onto thermoplastic resin material, and a resin original pattern plate therefor.

Transferring of relieved pattern of an original pattern plate onto to-be-processed material has been carried out in many fields. For example, when the identical printed matters are to be prepared in large quantity, especially in a short time period, duplicates, namely, printing plates are formed from one original pattern plate since the preparation of several or more original pattern plates requires considerable man power and time. In the relief printing of newspapers or magazines, matrices are prepared from the original pattern plate, and printing plates are reproduced from the matrix. In this case, the matrix in the former process and the printing plate in the latter process correspond to the to-be-processed material. For the original pattern plate, a type-assembled plate, an engraved original plate, etc. are used and for the material therefor, copper, zinc, lead, tin, antimony or alloys thereof are used. However, when the original pattern plate is to be manufactured with these materials, a considerable amount of manpower is required, working environment is bad such as pollution of atmosphere and generation of high temperature, and the original pattern plate manufactured is too heavy to handle. Recently, an etched metal plate using photosensitive resin resist has been used as the original pattern plate. In this method, photosensitive resin is applied on a surface of a metal plate and it is exposed, developed and washed to produce resin pattern and then those portions of the metal plate which are not covered by the resin are etched away to form a relief pattern. This process has disadvantages in that dangerous chemicals are used and waste liquid including a substantial amount of hazard metal is discharged. As an approach to this problem, photopolymerized resin plate has been developed to form resin pattern plate by the combination of a negative film and photo-polymerizable resin composition. However the resin pattern plate is exclusively used as the printing plate so that in a large scale printing requiring a number of printing plates this method is not practical because the cost is expensive and long time is required to prepare the printing plates. As matrix material for reproducing the original pattern plate, paper matrix is presently used widely but precise transfer of the original pattern is difficult and conditioning of the hardness of the paper by wetting or maturing is necessary prior to pressing the material to the original pattern plate. Furthermore since the paper matrix shrinks when it is shifted from wet condition to dry condition, the reproducibility of the original pattern is not always good. For these reasons, the original pattern plate and the matrix for reproducing printing plate which have overcome the above difficulties and facilitate efficient work have been sought in the field of printing.

In order to solve these problems the inventors of the present invention have made extensive study on the transferring condition using the resin original pattern plate and the resin material to be processed and found that a certain relationship was necessary between the elastic modulus of the resin original pattern plate and the fluidity of the material to be processed at the temperature on the contact surface of the resin original pattern plate and the material to be processed (or at transfer temperature). Based upon this finding a high performance resin original pattern plate usable in this transfer has also been provided.

The material to be processed must have sufficient fluidity to allow flowing into the relieved surface of the resin original pattern plate during transferring, but in the past it has been difficult to grasp the fluidity because of variety of relief of the original pattern plate and the complexity of the temperature behavior during transferring, and hence no method for producing satisfactory transferred article has been established. The inventors have extensively studied about the basic fluidity required for the material to be processed and found that the fluidity of 0.01 dg/min or higher, preferably 0.1 to 50 dg/min at transferring temperature under the condition of ASTM D1238 and load of 21.6 kg was necessary and that the material to be processed which met the above requirement could provide good transfer. With lower fluidity, the relief of the original pattern cannot be completely transferred or too long time is required to perform transferring and hence it is not practical. On the other hand, when the material to be processed has the fluidity of more than 50 dg/min, although transferring operation may be easy, thermoplastics having such high fluidity are generally small in molecular weight and thus obtained matrix is undesirably insufficient in strength. The material to be processed is thermoplastic resin. Since the thermoplastic resin, when heated above a predetermined temperature, is easy to be deformed by an external force or exhibit fluidity, it is easy to transfer the relief of the resin original pattern plate precisely. Further, it can retain its shape when cooled. When no further use is intended, the product may be heated to deformable or fluid condition for re-use. Since many sorts of thermoplastic resins are available, any particular resin suitable for the particular application can be selected. It is light in weight. Thus, the thermoplastic resin possesses many properties suitable for the material to be processed for the purpose of the present invention. The examples of the thermoplastic resin usable in the present invention are: polyethylene, polypropylene, polyvinyl chloride, polyacrylate, polymethacrylate, polystyrene, polycarbonate, polyamide and ABS. The mixture of these materials may be used as required, and filler, coloring agent, pigment, stabilizer, lubricant, and sub-material may be added.

The temperature at which these thermoplastic resins usable in the present invention may show a fluidity of 0.01 dg/min or higher under the condition of ASTM D1238 and load of 21.6 kg, should be 80° C. or higher. Accordingly, the transferring in the present invention is carried out at a temperature of 80° C. or higher. In view of practical processability, preferable temperature is 100° C. or higher, particularly 150° C. or higher. However, a temperature above 200° C. is not desirable because of a degradation of the thermoplastic resin occasionally caused by repeated employment and of economical view point.

On the other hand, the resin original pattern plate used for transferring must not be deformable or fluid during transferring in order to assure good transfer operation and it must withstand repeating transfer operation when two or more transferred articles are to be produced. The inventors have also made basic study on the transferring condition and found that the settings of the elastic modulus and the transferring pressure were important factors. According to the present invention, it is required for the resin original pattern plate to exhibit no fluidity at the transferring temperature and to possess an elastic modulus of more than 10 kg/cm$^2$, preferably more than 100 kg/cm$^2$, and for the transfer to be carried out under a pressure in which the elastic deformation of the original pattern plate is within 10%. When these requirements are not met, for example where the resin of the original pattern plate exhibits fluidity at the transferring temperature, the relief of the original pattern plate is damaged during transferring. Even if it does not exhibit fluidity, when the elastic modulus is less than 10 kg/cm$^2$, the original pattern plate, although not damaged, shows substantial elastic deformation and hence not effective for transferring. Although material of higher elastic modulus is preferable, the material having an elastic modulus higher than 10$^5$ kg/cm$^2$ is not desirable because such material often shows brittleness. In order to assure that the transfer of the pattern is carried out satisfactorily on the material to be processed, it is considered that the elastic deformation thereof should be within 10% at maximum, but where the elastic modulus is below 10 kg/cm$^2$, long transferring time will be required if the transferring pressure is reduced such that the elastic deformation is kept within 10%. Thus this approach is not practical. Thus, it is desirable that the resin original pattern plate has high elastic modulus so long as it exhibits no fluidity during transferring but too high elastic modulus is often undesirable because of brittleness.

In summary, it is one aspect of the present invention to provide a condition under which the relief of the resin original pattern plate is transferred to the to-be-processed material, and it is characterized in that the thermoplastic resin having the fluidity (under the condition of ASTM D1238 and load of 21.6 kg) of 0.01 dg/min or higher, preferably 0.1 to 50 dg/min at the transferring temperature is pressed onto the resin original pattern plate which exhibits no fluidity at the transferring temperature, and possesses the elastic modulus of 10 kg/cm$^2$ or higher, preferably 10$^2$ to 10$^5$ kg/cm$^2$, under the pressure condition where the elastic deformation of the original pattern plate is kept within 10%.

Another aspect of the present invention is to provide an improved resin original pattern plate for transferring the relieved pattern. By controlling the photo-polymerizable resin composition to adjust its cross-linkability, the resulting resin original pattern plate for relieved pattern transferring which possesses the elastic modulus of 10 kg/cm$^2$ or more at the transferring temperature is provided.

The use of photo-polymerization provides many advantages such as the easiness to manufacture a highly accurate resin original pattern plate by using a negative film, the elimination of the need to use dangerous chemicals, or light weight of the plate manufactured. Accordingly, it is very valuable if the photo-polymerization can be used in the manufacture of the original pattern plate of the present invention. Whereas, well-known photo-polymerized resin plate including as major part thereof, nylon, methacrylic resin, polystyrene, unsaturated polyesters, polyurethane, or cellulose acetate has a low heat-deforming temperature and softened upon heating, resulting in rapid decrease of the elastic modulus so that it exhibits substantial elastic deformation under the transferring pressure or exhibits fluidity. It has, therefore, been considered that this kind of photo-polymerized resin plate was not applicable to the resin original pattern plate for transferring the relieved pattern.

As mentioned above, in the present invention, the thermoplastic resin is used in temperature range from 80° C. to 200° C., and the transferring temperature may be selected within this temperature range. Accordingly, when a photo-polymerized resin possesses an elastic modulus of 10 kg/cm$^2$ or higher and does not show any fluidity at 200° C., this resin may be usable for original pattern plate of the present invention. As result of studying photo-polymerizable composition from such viewpoint as above, the present inventors found out that the following two kinds of composition, (1) and (2), by photo-polymerization, may have an elastic modulus of 10 kg/cm$^2$ or higher but no fluidity at 200° C. The resin composition includes as main parts thereof either (1) polymer free of cross-linkable double bonds, polyfunctional monomer, photo-sensitizer and thermal polymerization inhibitor, or (2) cross-linkable polymer, monomer, photo-sensitizer and thermal polymerization inhibitor. The compositions (1) and (2) can be mixed.

In case of the composition (1), the polyfunctional monomer forms a base for the formation of the cross-linked structure, and in order to provide the resin original pattern plate used in the present invention the polyfunctional monomer should be included at the proportion of 10% by weight to 90% by weight, preferably 30% by weight to 70% by weight with respect to the total weight of the composition. Also, the polymer should have a viscosity of 10$^3$ poise or higher preferably 10$^3$ to 10$^7$ poise at 200° C. In case of the composition (2), the cross-linkable polymer should have molecular weight of 1000 or more preferably 10$^3$ to 10$^6$ and include double bonds at least one for each 1000 molecular weight, preferably for each 200 molecular weight. Furthermore, the monomer should be included at the proportion of 5% by weight to 50% by weight, preferably 10% by weight to 40% by weight, with respect to the total weight of the composition. The compositions which do not meet the above requirements cannot be used for the resin original pattern plate of the present invention. For example, in case of the composition (1), if the amount of the polyfunctional monomer is insufficient, a satisfactory cross-linked structure is not obtained and the elastic modulus of more than 10 kg/cm$^2$ cannot be retained at 200° C. When the amount of the polyfunctional monomer is excessive, the product often exhibits brittleness although it retains high elastic modulus. When the viscosity of the polymer is low, the resin original pattern plate presents flow deformation. In case of the composition (2), if the amount of the double bonds is insufficient, or if the amount of the monomer is not within the range specified above, no effective cross-linkage is formed or subproduct of relatively low molecular weight homopolymer which does not play a role in forming the cross-linkage is produced in large amount, by the plasticization action of which the reduction of the elastic modulus and irreversible deformation due to the fluidity are brought about. The polymer usable for the composition (1), is a polymer free of cross-linkabe double bonds, includes polycondensates such as polyamide, polyester and polyurethane, modified natural macro-molecule compounds such as cellulose acetate, addition polymers such as polyvinyl alcohol, and polyacrylate, all of which are organic solvent-soluble. As the polyfunctional monomer, those monomers which include at least two radical-polymerizable double bonds. For example, they include bis-acrylamide group such as N,N'-methylene-bis-acrylamide, p (or m)-xylene-bis-acrylamide and m-phenylene-bis-acrylamide, dimethacrylate group such as triethylene glycol dimethacrylate, diacrylate group such as triethylene glycol diacrylate, and glycerine diacrylate and pentaerythritol tri-acrylate. For the cross-polymer in the composition (2), the polymers having radical-reactable double bonds in their molecules are used. For example, they include polymers having the double bonds in their main chains such as unsaturated polyester, polybutadiene and derivatives thereof, and unsaturated polyurethane, and polymers having unsaturated side chains. The monomer usable for the composition (2), is monofunctional monomer, includes vinyl monomers such as styrene, acrylic acid and ester thereof, methacrylic acid and ester thereof, vinyl acetate and acrylamide. For the photo-sensitizer, benzophenone group, anthraquinone group, benzoin group, benzoin alkylether group are used. Amount thereof to be used is in the range from 0.1 part by weight to 10 parts by weight, preferably from 1 part by weight to 5 parts by weight, per 100 parts by weight of the resin composition as shown as (1) and (2) above. For the thermal-polymerization inhibitor, pyrogallol, benzoquinone, naphthoquinone, hydroquinone, paramethoxyphenol are used. Amount thereof to be used is in the range from 0.01 part by weight to 1 part by weight, preferably 0.1 part by weight to 0.5 part by weight, per 100 parts by weight of the resin composition as shown as (1) and (2) above.

The thickness of the original pattern plate made from the photo-polymerizable composition is, variable depending upon the objective use thereof, in the range about from 0.1 mm to 5 mm, generally from 0.5 mm to 1 mm.

For manufacturing relieved pattern plate from the photo-polymerizable composition, conventional apparatus and method can be employed. For example, there may be employed a method comprising closely applying a negative film, when the photo-polymerizable resin is liquid, to poured resin which is covered by a cover film, or when the photo-polymerizable resin is solid, directly to that made into a plate form, exposing to light source, and then after removing the negative film and the cover film, washing out unexposed areas and drying the resulting resin original pattern plate. For a light exposing lamp, an ultra-violet fluorescent lamp, halogen lamp, mercury lamp or arc lamp may be usually used.

In order to enhance photo-polymerization it is important to increase the intensity of the light source. The degree of the photo-polymerization increases with the extension of the light exposure time. However, in practice, the exposure time is within 30 minutes or less, preferably in the range from 2 to 20 minutes. When the cross-linkage is not provided sufficiently by the light during the preparation of the pattern plate, it will be effective to further apply exposing or heating step after the preparation to enhance the degree of cross-linkage.

By enhancing the degree of photo-polymerization in this manner, the resin original pattern plate does not produce the fluidity deformation and can still remain an elastic modulus of 10 kg/cm$^2$ or more.

The material used for the relieved pattern transfer in accordance with the present invention is not necessarily manufactured by the photo-polymerization process described above so long as it satisfies the requirements of the present invention. For example, cross-linked resin such as unsaturated polyester resin, phenol resin, resorcinol resin, urea resin, melamine resin, or thermoplastic resin having high heat deformation temperature such as arylene ether resin, p-hydroxy benzoic acid resin, polyimide and polysulphone may be used, on which relief pattern is formed by engraving or other method to form the original plate.

Any temperature and pressure under which transferring of the present invention is performed can be set so long as they meet the requirements of the present invention. For a given material to be processed, the fluidity thereof is measured to determine the temperature at which the material shows the fluidity of 0.01 dg/min or higher. According to this result, resin material for the original pattern plate which shows the elastic modulus of 10 kg/cm$^2$ or higher at that temperature is selected, and from that elastic modulus the pressure under which the elastic deformation is kept within 10% can be determined. Conversely, for a given material of the resin original pattern plate, the temperature at which no fluidity is shown and the elastic modulus of more than 10 kg/cm$^2$ is maintained must be determined. Based on that temperature, the material to be processed which shows the fluidity of 0.01 dg/min or more at that temperature is selected. The transferring of the present invention may be more conveniently carried out when using the resin original pattern plate obtained from the photopolymerizable composition as mentioned above. Such a plate must have an elastic modulus of 10 kg/cm$^2$ or higher at 200° C., and accordingly, it should show, of course, an elastic modulus of 10 kg/cm$^2$ or higher at the transferring temperature of the present invention, that is, in the range from 80° C. to 200° C. Accordingly, when using a temperature at which the thermoplastic resin possesses fluidity of 0.01 dg/min or more and a pressure under which elastic deformation at said temperature of the original pattern plate is kept within 10%, the transferring can be desirably effected. It is convenient to determine the elastic modulus by measuring a dynamic elastic modulus using a dynamic elastic modulus measuring device, although any other method may be employed. In this manner, the resin original pattern plate, the material to be processed, the transferring temperature and the transferring pressure are determined. Transferring can be effected in various ways. For example, the to-be-processed material may be bent or in planer shape conformed with the shape of the resin original pattern plate or it may be in the form of powder or grains. It may be supplied in molten state. The resin original pattern plate may be pre-heated. The transferring temperature may be measured by inserting a thermocouple between the resin original pattern plate and the to-be-processed material. For transfer, a plane press or roll press may be used. The thermal condition of the press is preferably adjusted previously so that the transferring temperature meets the requirements of the present invention. Normally, the transfer is effected within ten minutes, generally within 5 seconds to one minute. After being pressed for the given time period, the to-be-processed material is cooled below the heat-deforming temperature of that material and separated from the resin original pattern plate. In this manner, an improved transferred article can be produced. In this case, in order to facilitate the separation from the resin original pattern plate, mold releasing agent can be used. Examples of such agent include silicone oil, molybdenum disulfate and graphite.

The relief transfer of the present invention can be applied not only to the preparation of the matrix or the printing plate in the field of printing but also to reproduction in any of the various fields, such as the formation of decoration plates, fine arts, stamps, industrial products and mechanical and electrical parts.

For the purpose of describing the present invention more particularly, several examples are given below, although it is not intended to limit the present invention to any of these particular examples. In the Examples, all parts and percentages are by weight, unless otherwise specified.

EXAMPLE 1

(1) Preparation of photo-polymerizable resin composition

Composition I: Mixture consisting of 10 parts of fumaric acid. 5 parts of phthalic anhydride and 16 parts of triethylene glycol was reacted up to the acid value of 32.0 in nitrogen atmosphere at 200° C. to produce unsaturated polyester resin.

Added thereto were styrene as the monomer to the extent of 10% with respect to total weight, and 1% of benzoin isopropyl ether as the photo-sensitizer to produce liquid photo-polymerizable resin composition I.

Composition II: Similar process as stated in connection with the composition I was repeated to produce photo-polymerizable resin composition II having 25% monomer styrene added thereto.

Composition III: Similar process as stated in connection with the composition I was repeated to produce photo-polymerizable resin composition III having 40% of monomer styrene added thereto.

Composition IV: Similar process as stated in connection with the composition I was repeated to produce photo-polymerizable resin composition IV having 60% of monomer styrene added thereto.

Composition V: To 50 parts of polyvinyl alcohol (30% aqueous solution) having polymerization degree of 500 and saponification value of 88% were added 50 parts of monomer, $\beta$-hydroxyethyl methacrylate and 1 part of photo-sensitizer, benzoin isopropyl ether to produce mixture, which was then cast on a Teflon sheet and dried at 60° C. for six hours to produce solid state photo-polymerizable resin sheet V. It did not include cross-linkable polyfunctional monomer.

Composition VI: To 100 parts of alcohol soluble copolymer polyamide were added 60 parts of bifunctional monomer, m-xylylene-bis-acrylamide, 20 parts of triethylene glycol diacrylate and 1 part of benzoin methylether to prepare mixture and 30% methanolic solution of said mixture was cast on a Teflon sheet and then dried. The resulting solid product was chopped and pressed at 130° C. to produce transparent, solid state photo-polymerizable resin composition VI.

(2) Preparation of resin original pattern plate

In case of liquid photo-polymerizable resin composition (compositions I, II, III and IV), spacers of 0.7 mm were positioned on a tin plate having paint layer applied thereon. The photo-polymerizable resin composition was poured on the tin plate and a transparent cover film was laid thereon. Thereafter through a negative film positioned on the cover film in intimate contact relation the resin composition was exposed for 15 minutes by ten ultra-violet fluorescent lamps (20 W) positioned at 10 cm above the negative film. The condition of exposure is common to all other samples. After exposure the cover film was removed and unexposed areas were washed away with aqueous solution containing 1% of alkali. The resin was then dried. A relief pattern of 0.7 mm depth was produced on the tin plate. In addition, the same resin composition was applied onto a Teflon sheet and illuminated simultaneously with the exposure of the relief plate to produce sheet-like samples I, II, III and IV for measuring dynamic elastic modulus. The relief plate and the sheet for the composition II were further heat-treated in nitrogen atmosphere at 230° C. for 26 hours to further proceed cross-linking. The product was designated as sample VII.

In case of the composition V, solid state photo-polymerizable resin composition in sheet form prepared in the process described above was in part exposed together with the resin original pattern plate to form sample V for measuring dynamic elastic modulus, and in part bonded on a tin plate having paint layer thereon with aqueous solution of polyvinyl alcohol. A negative film was positioned directly on the resin surface, which was then exposed to the light by a vacuum contact printing device. The unexposed areas were washed away to produce a relief plate of 0.7 mm depth.

In case of the composition VI, the photo-polymerizable resin composition VI was placed on a tin plate having a paint layer thereon and the assembly was pressed at 130° C. to produce a photo-polymerizable resin plate. A negative film was over-layed and the resin plate was exposed. The unexposed areas were washed away by methanol to produce a relief plate of 0.7 mm thickness. The sheet-like photo-polymerizable resin composition produced by pressing between aluminum foils was also exposed to produce sample VI for measuring the dynamic elastic modulus.

With the samples I to VII thus prepared, the temperature dependency of the dynamic elastic modulus at 11 cycles was measured by a dynamic visco-elasticity measuring device (manufactured by Toyo Sokki). The resultant dynamic elastic modulus is given below.

Sample I: Substantially constant at 60 kg/cm$^2$ between 80°–200° C.
Sample II: Substantially constant at 200 kg/cm$^2$ between 110°–200° C.
Sample III: Gradually decreases beyond 130° C. 120 kg/cm$^2$ at 220° C.
Sample IV: Rapidly decreases beyond 100° C. Impossible to measure beyond 160° C., and starts to exhibit fluidity.
Sample V: Rapidly decreases beyond 170° C. and impossible to measure.
Sample VI: Maintains 400 kg/cm$^2$ at 200° C.
Sample VII: Maintains 300 kg/cm$^2$ beyond 170° C., and even beyond 210° C.

(3) Transfer Test

The photo-polymerized resin original pattern plates of A-6 (105 m/m × 148 m/m) size of the compositions I to VII were prepared. Overlayed on those photo-polymerized resin original pattern plates were polypropylene sheet (the fluidity at 21.6 kg, 200° C. was 9 dg/min.) of 2.0 mm thickness and they were pressed at 200° C. under 3.0 kg/cm². For the resin original pattern plate of the composition II (present example), polypropylene transfer of high reproducibility was obtained and no appreciable damage was observed on the resin original pattern plate. For the resin original pattern plates of the compositions I, II, VI and VII (present examples), high quality of transfer was obtained without any appreciable change in the original pattern plates after pressing. For the resin original pattern plates of the compositions IV and V (comparative examples), thermal deformation of the resin original pattern plate after pressing was substantial and the transfer was not obtainable.

(4) Test of embossed plate preparation

The photo-polymerized resin plate prepared with the composition II using a patterned negative film was overlayed as an embossed original pattern plate on a polypropylene sheet (the fluidity at 21.6 kg, 190° C. was 7 dg/min.) of 2.0 mm thickness. They were pressed at 190° C. under 4 kg/cm² to produce polypropylene sheet having embossed pattern of 0.3 mm depth. No deformation of the resin original pattern plate was observed. Similarly, relieved plate prepared with the composition V was used as an embossed original pattern plate and pressed. The original pattern plate in this case showed substantial deformation.

EXAMPLE 2

The resin original pattern plate of 0.5 mm thickness was prepared in the similar manner with 70 parts of unsaturated polyester (acid value 30) and 30 parts of styrene, and transferring was effected under the following conditions. The results are listed below.

| Material to be processed | Fluidity at 21.6 kg. (dg/min) | Transferring condition (transferring temperature, pressure and time) | Resultant transfer |
|---|---|---|---|
| Polycarbonate | 0.3 (195° C.) | 195° C. 3.5 kg/cm² 20 sec. | Transfer of high quality. No damage of original pattern plate after 5 times of transfer. |
| Polypropylene | 5.1 (195° C.) | 195° C. 3.0 kg/cm² 50 sec. | Transfer of high quality. No damage of original plate pattern. |
| High density polyethylene | 8.3 (190° C.) | 190° C. 3.0 kg/cm² 40 sec. | Transfer of high quality. No damage of original plate pattern. |
| ABS | 1.65 (170° C.) | 170° C. 4.0 kg/cm² 40 sec. | Transfer of high quality. No damage of original plate pattern. |
| MMA | 0.78 (170° C.) | 170° C. 5.0 kg/cm² 60 sec. | Transfer of high quality. No damage of original plate pattern. |

Note:
The elastic modulus of the resin original pattern plate at a temperature range of 170°-200° C. was 230 kg/cm²-210 kg/cm², and the elastic deformation of the resin original pattern plate under any of the above transferring conditions was less than 10%.

For comparison, MMA which showed the fluidity of less than 0.01 dg/min at 170° C. was used under the transferring condition of 170° C., 5 kg/cm² and 60 seconds, but the resultant transfer included many areas to which relieved pattern of the resin original pattern plate was not precisely transferred.

EXAMPLE 3

To 90 parts of unsaturated polyester (acid value 34) and 10 parts of styrene was added 1 part of benzoin isopropyl ether as photo-sensitizer to form photo-polymerizable resin composition. With this composition a relieved plate of 0.5 mm thickness was formed. The resin thus obtained did not exhibit fludity at 200° C. and showed the elastic modulus of 50 kg/cm². Pressed to this original pattern plate was ABS resin sheet (the fluidity at 21.6 kg, 180° C. was 3.0 dg/min) of 2 mm thickness, at 180° C. for 30 seconds under 3.0 kg/cm². Under these conditions, the elastic deformation of the resin original pattern plate was 4.9%. The resulting transfer was of high quality, and no damage such as tear or deformation of the resin original pattern plate was observed.

EXAMPLE 4

70 parts of unsaturated polyester resin (acid value 22) and 30 parts of β-hydroxyethyl methacrylate were treated in the same manner on a tin plate for photo-polymerization to produce a relieved plate of 0.6 mm thickness. The resin thus formed did not exhibit fluidity at 200° C. and showed the elastic modulus of 100 kg/cm². Using it as a resin original pattern plate, polycarbonate (the fluidity at 21.6 kg, 195° C. was 0.4 dg/min) was pressed for 20 seconds at the transferring temperature of 195° C. under the pressure of 3.5 kg/cm². It was then rapidly cooled down to 105° C. resulting in the transfer of polycarbonate of high quality. Eleven additional transfers were produced in the same manner, all of which were of high quality and no damage of the original pattern plate was observed. Furthermore, transferring was carried out on polypropylene (fluidity at 21.6 kg 195° C. was 5.8 dg/min) under the same condition resulting in fifteen transfers of high quality and no appreciable damage of the original pattern plate.

What is claimed is:

1. A resin original pattern plate for use in transferring a relieved pattern, said pattern plate (a) having an elastic modulus of at least 10 kg/cm² at 200° C., (b) a thickness of from about 0.1 mm to about 5 mm, and (c) being prepared by controlling the cross-linkability of a photo-polymerizable resin composition and then photo-polymerizing, wherein said photo-polymerizable resin composition is (1) a photo-polymerizable resin composition comprising, as its major ingredients, a polymer free of cross-linkable double bonds, a polyfunctional monomer, a photosensitizer, and a thermal polymerization inhibitor, said poly-functional monomer constituting about 10 to about 90% by weight of the total weight of said composition and said polymer free of cross-linkable double bonds having a viscosity of at least 10³ poise at 200° C. or (2) a photo-polymerizable resin composition comprising, as its major ingredients, a cross-linkable polymer, a monomer, a photosensitizer, and a thermal polymerization inhibitor, said cross-linkable polymer having a molecular weight of at least 1,000 and containing double bonds in an amount of at least one for each 1,000 molecular weight, and said monomer constituting 5 to 50% by weight of the total weight of the composition.

2. A resin original pattern plate as defined in claim 1, wherein said polyfunctional monomer controlling 30-70% by weight of total weight of the composition.

3. A resin original pattern plate as defined in claim 1, wherein said cross-linkable polymer contains double bonds in an amount of at least one for each 200 molecular weight, and said monomer constitutes 10-40% by weight of total weight of the composition.

* * * * *